United States Patent [19]
Schep et al.

[11] Patent Number: 5,936,402
[45] Date of Patent: Aug. 10, 1999

[54] MAGNETO-RESISTIVE MAGNETIC FIELD SENSOR WITH A CONSTRICTED REGION

[75] Inventors: Cornelis M. Schep; Martinus A.M. Gijs, both of Eindhoven, Netherlands

[73] Assignee: U.S. Philips Corporation, New York, N.Y.

[21] Appl. No.: 08/873,258

[22] Filed: Jun. 11, 1997

[30] Foreign Application Priority Data

Jun. 12, 1996 [EP] European Pat. Off. .............. 96201637

[51] Int. Cl.⁶ .............................. G01R 33/09; G11B 5/39
[52] U.S. Cl. ........................ 324/252; 338/32 R; 360/113
[58] Field of Search .............................. 324/207.21, 252; 360/113; 338/32 R

[56] References Cited

U.S. PATENT DOCUMENTS

| | | | |
|---|---|---|---|
| 5,193,038 | 3/1993 | Smith ................................. | 324/252 X |
| 5,474,833 | 12/1995 | Etienne et al. ...................... | 324/252 X |
| 5,691,865 | 11/1997 | Johnson et al. ......................... | 360/113 |
| 5,712,612 | 1/1998 | Lee et al. ............................. | 324/252 X |

OTHER PUBLICATIONS

"Giant Magnetoresistance in Spin–Valve Multilayers", by B. Dieny, Journal of Magnetism and Magnetic Materials, vol. 136, 1994, pp. 335–359. (No Month).

"Anisotropic Magnetoresistance in Ferromagnetic 3d Alloys", by T.R. McGuire et al, IEEE Trans. Magnetics, vol. MAG–11, No. 4, Jul. 1975, pp. 1018–1038.

"Fabrication of Metallic Nanoconstrictions", by P.A.M. Holweg et al, Microelectronic Engineering, vol.1 11 1990, pp. 27–30, (No Month).

*Primary Examiner*—Gerard Strecker
*Attorney, Agent, or Firm*—David R. Treacy

[57] ABSTRACT

Two magnetic layers are mutually interconnected by a constricted region also made of a magnetic material. The layers may be separated by an intermediate non-metallic layer having a hole filed with magnetic material to from the constricted region. Alternatively, the layers and constricted region may be substantially co-planar. The constricted region minimum cross-section dimension preferably is less than one micron, and ideally of the order of 100 nm, thus being much smaller than the diameter of a magnetic domain. A high magneto-resistance ratio is obtained, and electrical and magnetic properties of the sensor can be adjusted largely independently.

17 Claims, 5 Drawing Sheets

MAGNETO-RESISTIVE MAGNETIC FIELD SENSOR WITH A CONSTRICTED REGION

BACKGROUND OF THE INVENTION

The invention relates to a magneto-resistive magnetic field sensor.

Such a sensor demonstrates a so-called magneto-resistance effect, whereby the electrical resistance of the sensor can be influenced by exposing it to a magnetic field. Magnetic flux variations to which the sensor is exposed can thus be converted into corresponding electrical voltage variations across the sensor, thereby allowing the magnetic flux to be electrically "read". Sensors of this type may be employed inter alia:

- as magnetic heads, which can be used to decrypt the magnetic flux emanating from a recording medium in the form of a magnetic tape, disc or card;
- in compasses, for detecting the terrestrial magnetic field, e.g. in automotive, aviation, maritime or personal navigation systems;
- as field sensors in medical scanners.

Magneto-resistance effects are discussed in general in the following articles:

(a) T. R. McGuire and R. I. Potter, IEEE Trans. Magnetics MAG-11 (1975), pp 1018–1038. This article discusses the so-called anisotropic magneto-resistance effect, whereby the electrical resistance of a ferromagnetic material is dependent on the orientation of its magnetization with respect to the direction of an electrical current through the material;

(b) B. Dieny, J. Magn. Magn. Mater. 136 (1994), pp 335–359. This article discusses the so-called spin-valve magneto-resistance effect, whereby the electrical resistance of a pair of exchange-coupled ferromagnetic layers depends on the relative orientation of the magnetizations in the two layers.

The electrical resistance R of a magneto-resistive body can be measured by applying a known electrical voltage V across it and measuring the electrical current I thereby induced, the ratio of V to I yielding the value of R. The resistance values thus measured, in both the absence ($R_o$) and presence ($R_s$) of an appropriate magnetic field (switching field) $H_s$, can be employed to calculate the magneto-resistance ratio (MR) using the formula:

$$MR = \frac{|R_o - R_s|}{R_s}$$

Typical MR-values for prior-art magneto-resistive sensors are of the order of 0.5–2% (at room temperature). Such relatively low MR-values generally lower the sensitivity of the associated sensors.

The switching field $H_s$ hereabove referred to is the (minimum) applied magnetic field required to cause magnetization-reversal in a ferromagnetic body. In an ideal magneto-resistive field sensor, the value of $H_s$ is preferably as small as is practicable, whereas the MR-value is preferably as large as possible. A problem with known sensors is that, in general, these two conditions cannot be simultaneously met, and that a compromise has to be struck.

OBJECTS AND SUMMARY OF THE INVENTION

It is an object of the invention to provide a magneto-resistive magnetic field sensor which demonstrates a relatively large magneto-resistance ratio (at room temperature and for relatively low applied magnetic fields). It is a further object of the invention that it should be possible to independently adjust the electrical and magnetic properties of such a sensor, at least to a relatively large degree. In particular, it is an object of the invention that the said sensor should have a relatively low switching field.

These and other objects are achieved according to the invention in a magneto-resistive magnetic field sensor which is characterized in that it comprises two magnetic layers which are mutually interconnected via a constricted region composed of magnetic material having a volume much less than the respective volumes of the magnetic layers (hereinafter referred to as a constriction).

Assuming that the inventive sensor is employed in such a manner that its electrical resistance is measured across the constriction (i.e. with a current-flow from one magnetic layer to the other magnetic layer via the constriction), the sensor's electrical resistance will effectively derive solely from that constriction. Consequently, since the volume of this constriction is only a tiny fraction of the volume of the magnetic layers which it interconnects, the magnetic properties of the sensor (derived from the magnetic layers and any magnetic materials adjacent thereto) can be adjusted substantially independently of the electrical properties of the sensor (derived from the constriction). In particular, this allows a relatively low $H_s$-value to be realized (e.g. by appropriate choice of the constitution, thickness and geometrical form of the magnetic layers) without having to sacrifice a large MR-value.

For the same reasons set forth in the previous paragraph, it is possible to have a flux guide in direct contact with one of the magnetic layers without causing a reduction in the sensor's MR-value. This allows such a sensor to have a greatly enhanced efficiency.

The fact that the sensor's electrical resistance derives essentially from the constriction, rather than from the magnetic layers, also allows a substantially increased MR-value to be obtained. This can be explained as follows.

The electrical resistance of a ferromagnetic material arises both from an intra-domain and an inter-domain contribution. In many applications, the intra-domain contribution and its magnetic field dependence are exploited to detect magnetic signals. The inter-domain contribution can have a much stronger magnetic field dependence than the intra-domain contribution, but, in usual ferromagnetic materials, the inter-domain contribution is overwhelmed by the intra-domain contribution, so that attainable MR-values are kept small.

In the sensor according to the invention, resistance measurements are concentrated in a highly localized resistive volume (the constriction) rather than a relatively wide resistive volume (the whole volume of a magnetic layer). Since the constriction acts as a pinning center for domain walls, the average volume-density of magnetic domains relative to the employed resistive volume is very much increased. This leads to an attendant increase in the relative role of inter-domain resistance effects, to an extent which depends on the width $w_c$ of the constriction. As will become evident hereunder, the smaller the value of $w_c$ the better.

For the sake of clarity, the quantity $w_c$ as here employed is understood to refer to the smallest dimension (width) of the constriction as measured parallel to the plane of the magnetic layers. The value $w_c$ is therefore the least dimension of the cross-section of the constricted region.

An advantageous embodiment of the sensor according to the invention is characterized in that the $w_c < 1\ \mu m$. Since the average magnetic domain size D in a typical ferromagnetic sample will generally be of the order of 10 μm, this measure ensures that $w_c \ll D$. In a particular scenario investigated by the inventors, the system formed by the two magnetic layers and the constriction contains only one domain wall, and this is generally located in the constriction, where it has the smallest area and thus the lowest energy. Assuming $w_c$ to be significantly larger than the mean free path length of an electron in the material of the magnetic layers, the inventors have determined that:

$$MR \approx \frac{r}{\rho w_c}$$

in which r is the domain interface resistance and ρ is the resistivity of the material of the magnetic layers. For iron (for example), $r \approx 3 \times 10^{-15}$ Ω m² and $\rho \approx 10$ μΩ cm (at room temperature), so that $MR \approx 30/w_c$ ($w_c$ in nm). It is then clear that:

If $w_c$ has a value of 1 μm, MR will be approximately 3%, which is comparable to the performance of prior art sensors;

If $w_c$ has a value less than 1 μm, MR will substantially exceed the values obtainable with prior art sensors (e.g. if $w_c$=250 nm, then $MR \approx 12\%$).

The actual domain pattern in a given sensor according to the invention may be different from the simple single-domain-wall scenario discussed in the previous paragraph, but the background principles remain the same: the magnetic microstructure in the constriction is substantially altered by manipulating the magnetizations in the magnetic layers.

A preferential embodiment of the sensor according to the invention is characterized in that $w_c \leq 100$ nm. Not only does such an embodiment entail a substantially increased value of MR (30% or more, using the values of r and ρ quoted above for Fe), but it also advantageously entails a relatively large value of the electrical resistance of the sensor as a whole (of the order of 1 Ω at room temperature). As will be elucidated herebelow, it is relatively easy to fabricate constrictions for which $w_c$ is of the order of 10–50 nm, leading to MR-values of the order of 50–60% or more.

A particular embodiment of the sensor according to the invention is characterized in that the two magnetic layers are arranged in a stack and are separated by an intermediate non-metallic layer, whereby the non-metallic layer contains a hole which is filled with magnetic material so as to form the constriction. Such a hole preferably has a substantially round or oval cross-section, and may, for example, be approximately cylindrical or "hour-glass-shaped" (i.e. with a "waist" which is relatively narrower than the rest of the hole); in such a case, $w_c$ is the diameter of the whole at its narrowest point (waist).

The term "non-metallic" as here employed with reference to the intermediate layer should be interpreted broadly. In general, the term refers to any substance which does not have metallic electrical conduction properties. More particularly, the term is not only intended to refer to solid materials, but also to liquids, gases or vacuum. In addition, the term "layer" as here employed is intended to encompass non-metallic multilayer structures (such as a $Si_3N_4$/NiO bilayer, for example). In a particular embodiment of the sensor according to the invention, the non-metallic material is selected from the group consisting of silicon, silicon oxide, silicon nitride and aluminium oxide. Using selective masking and etching techniques, thin layers of such dielectric materials can be provided with well-defined, localized holes having a width $w_c$ as small as 15–50 nm: see, for example, the article by P. A. M. Holweg et al. in Microelectronic Engineering 11 (1990), pp 27–30. Alternatively, Embodiment 3 below shows how naturally-occurring "pinholes" in the non-metallic layer can be filled with magnetic material, so as to create magnetic constrictions as required by the invention.

The thickness of the non-metallic layer in the previous paragraph is preferably of the order of 10–50 nm, though other thicknesses are allowed according to the invention.

An alternative embodiment of the sensor according to the invention is characterized in that the two magnetic layers and the constriction are substantially co-planar. Such a structure can, for example, be manufactured using selective masking and etching techniques, whereby a uniform layer of magnetic material on an insulating substrate is etched into two separate portions which are only interconnected by a narrow bridge of remaining material (the constriction).

In the inventive sensor, the magnetic layers and the magnetic constriction preferably comprise a single magnetic material. This is so as to prevent unwanted scattering phenomena at the interfaces between different materials (e.g. in the case of a Co layer and a Fe layer separated by a Co constriction), which tend to reduce the relative inter-domain contribution to the electrical resistance. Suitable examples of a single magnetic material for use in the sensor include Fe, Co, Ni and their alloys (e.g. permalloy or $(Fe_xNi_{1-x})_yCo_{1-y}$, 0<x,y<1), together with $Fe_3O_4$ (magnetite) and PtMnSb.

If so desired, the sensor according to the invention may comprise additional magnetic material besides that already present in the magnetic layers and constriction; for example, a layer of soft-magnetic material may be stacked with at least one of the magnetic layers, so as to reduce the sensor's $H_s$-value, or an exchange-biasing layer may be stacked with one of the magnetic layers, so as to "pin" its magnetization in a particular direction. In addition, at least one of the magnetic layers can be structured into a given geometrical form, if so desired; for example, one of the magnetic layers may be disc-shaped (round or oval), so that its shape anisotropy will be essentially zero, thereby tending to lower $H_s$.

If so desired (or if it is a consequence of a particular manufacturing procedure), there may be several connective magnetic constrictions between the magnetic layers. However, the presence of such multiple constrictions (in parallel circuit arrangement) will tend to reduce the electrical resistance of the sensor.

The thickness $t_m$ of the magnetic layers is preferably very much greater than $w_c$. This is because the resistance $R_c$ of the constriction is given by the relationship $R_c \sim \rho/w_c$, whereas the sheet resistance $R_\square$ of a magnetic layer is given by the relationship $R_\square \sim \rho/t_m$, in which ρ is the electrical resistivity of the material of the magnetic layers (and constriction). It therefore follows that, if $R_c$ is to dominate, then $t_m$ should be much greater than $w_c$. It should be explicitly noted that both magnetic layers do not have to have the same thickness $t_m$.

A particular embodiment of the sensor according to the invention is characterized in that it comprises at least one flux guide which serves to concentrate magnetic flux from an external source into the vicinity of the magnetic layers. As already explained hereabove, such a flux guide may actually be in contact with one of the magnetic layers.

It should be explicitly noted that the sensor according to the current invention is clearly distinguished from the sensor described in International Patent Application WO 95/26547, by a number of features. These include the following:

The structure in WO 95/26547 is always a stacked structure: there is no coplanar embodiment as in the case of the current invention;

The connective passage in WO 95/26547 contains a multilayer structure, comprising alternately arranged magnetic and non-magnetic layers. In contrast, the constriction in the present invention comprises magnetic material only: there is no multilayer structure and no non-magnetic material;

The layers on either side of the constriction in the present invention are required to be magnetic layers. On the other hand, in WO 95/26547, the layers on either side of the connective passage are only required to be metallic layers.

BRIEF DESCRIPTION OF THE DRAWINGS

The invention and its attendant advantages will be further elucidated with the aid of exemplary embodiments and the accompanying schematic drawings, whereby.

Corresponding features in the various Figures are denoted by the same reference symbols.

DESCRIPTION OF THE PREFERRED EMBODIMENTS

Embodiment 1

Figure 1:
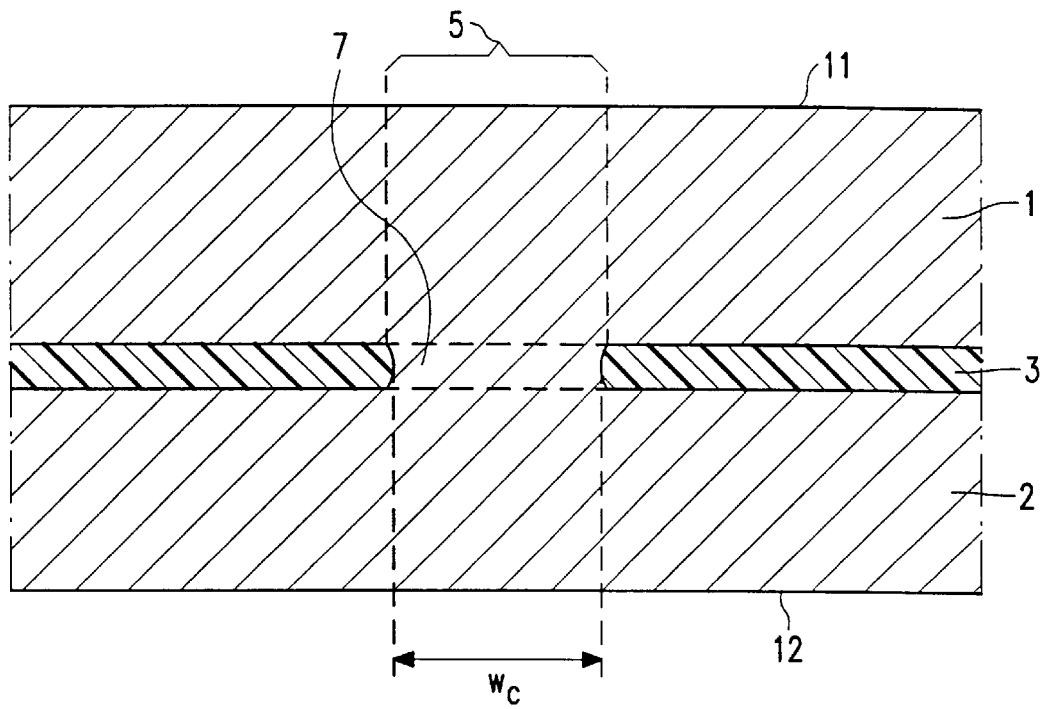
FIG. 1 renders a cross-sectional view of part of a particular embodiment of a magneto-resistive magnetic field sensor according to the invention, employing a stacked structure.

FIG. 1 renders a cross-sectional view of part of a magneto-resistive magnetic field sensor according to the present invention. The sensor comprises two magnetic layers 1,2 which are separated by an intermediate non-metallic layer 3. The non-metallic layer 3 contains a (substantially circular) hole 5 of width (smallest diameter) $w_c$, which is filled with magnetic material. This material is the same as the magnetic material of which the layers 1 and 2 are comprised. In this manner, a connective magnetic constriction 7 is formed between the two layers 1,2.

In a particular embodiment, each of the layers 1,2 has a thickness of 600 nm, the layer 3 has a thickness of 40 nm, and $w_c \approx 60$ nm. The material in the magnetic layers 1,2 and the constriction 7 is Fe, whereas the intermediate layer 3 is comprised of $SiO_2$. Such a sensor demonstrates an MR-value of 50%, a $H_s$-value of 40 kA/m and an electrical resistance across the constriction 7 of two ohms (all at room temperature). Preferentially, the sensor's electrical resistance is determined by measuring the resistance between electrodes (not depicted) which are provided on the respective faces 11,12 of the magnetic layers 1,2.

Embodiment 2

Figure 2:
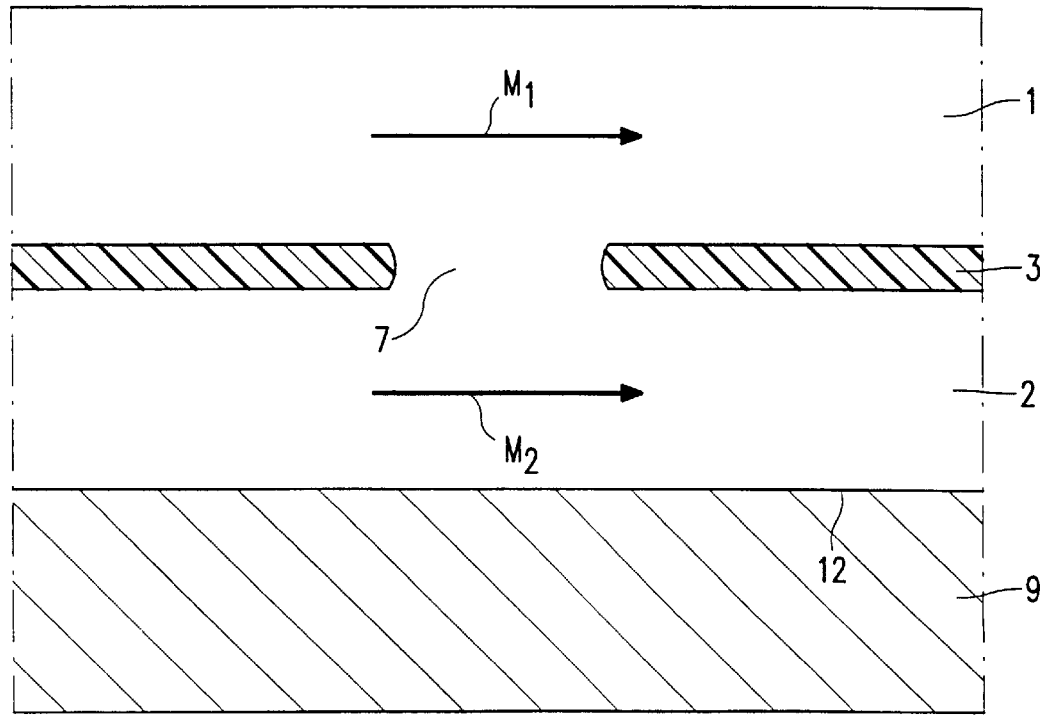
FIG. 2 depicts the subject of FIG. 1 in zero field, after its provision with an exchange biasing layer.
Figure 3:
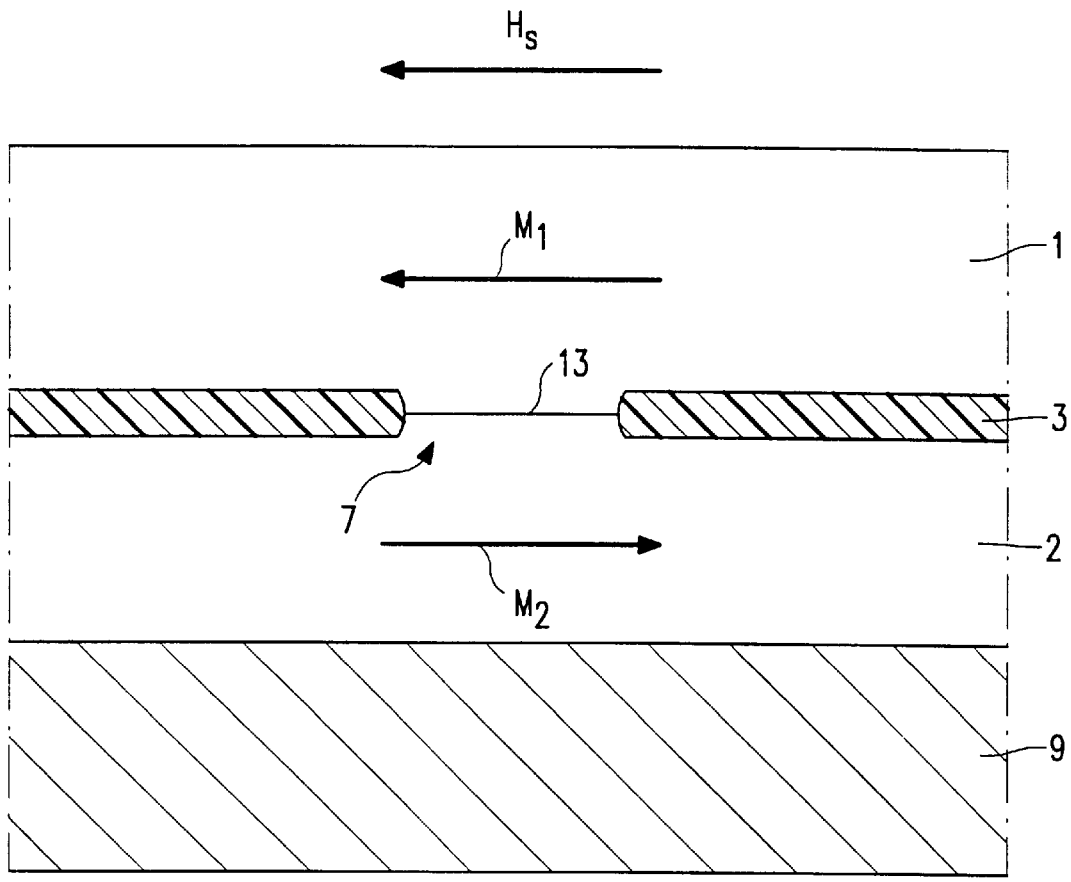
FIG. 3 shows the subject of FIG. 2 in the presence of an applied magnetic switching field.

FIGS. 2 and 3 give a cross-sectional depiction of part of a particular embodiment of a sensor according to the invention, showing various aspects of its operation. The sensor is identical to that shown in FIG. 1, except for the presence of an exchange-biasing layer 9 in contact with the magnetic layer 2. In this particular example, the layer 9 comprises $Fe_{0.5}Mn_{0.5}$, whereas the magnetic layers 1,2 and the constriction 7 comprise permalloy. The width $w_c$ of the constriction 7 is 50 nm. For clarity purposes, the magnetic layers have not been hatched.

FIG. 2 shows the situation in zero field. In this case, the magnetic layers 1,2 are ferromagnetically coupled, so that their respective magnetizations $M_1$, $M_2$ are parallel. There are no domain walls present. This is the sensor's low-resistance configuration.

In FIG. 3, a magnetic field $H_s$ has been applied anti-parallel to $M_2$, causing $M_1$ to reverse its direction. The direction of $M_2$ does not change, due to the exchange biasing between layers 2 and 9. A single (lateral) domain wall 13 forms in the constriction 7. This is the sensor's high-resistance configuration.

As an alternative to the use of an exchange biasing layer 9, the magnetization $M_2$ of the layer 2 can be "pinned" (in the relative sense) by making layer 2 thinner than layer 1. Further alternatives include:

depositing layer 2 in direct contact with a body of hard-magnetic material;

structuring layer 2 so as to endow it with an increased shape anisotropy, e.g. by etching it into a elongated form.

In this particular embodiment, the magnetic layers 1,2 are ferromagnetically coupled in zero field. In an alternative scenario, the layers 1,2 are antiferromagnetically coupled in zero field, and the magnetizations $M_1$, $M_2$ can be forced into a mutually parallel arrangement by application of a magnetic field $H_s$ parallel to one of them.

Embodiment 3

Figure 4:
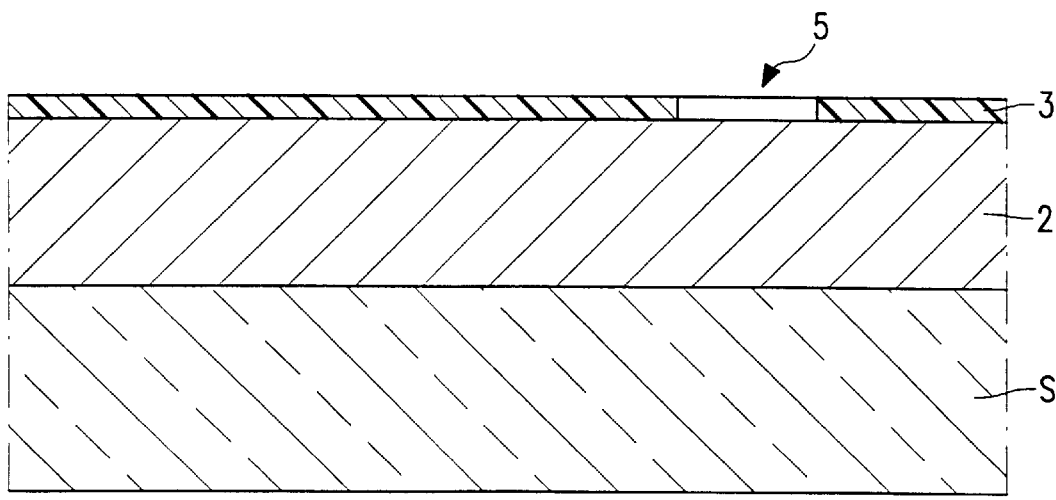
FIG. 4 depicts a first manufacturing step in the production of a device as shown in FIG. 1.
Figure 5:
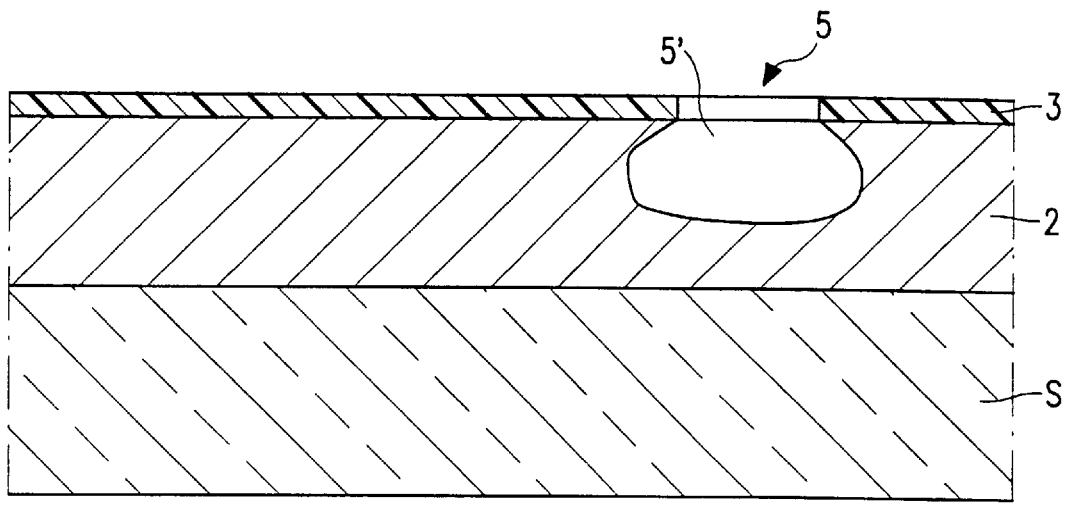
FIG. 5 shows the subject of FIG. 4, subsequent to the performance thereupon of a second manufacturing step (etching procedure)
Figure 6:
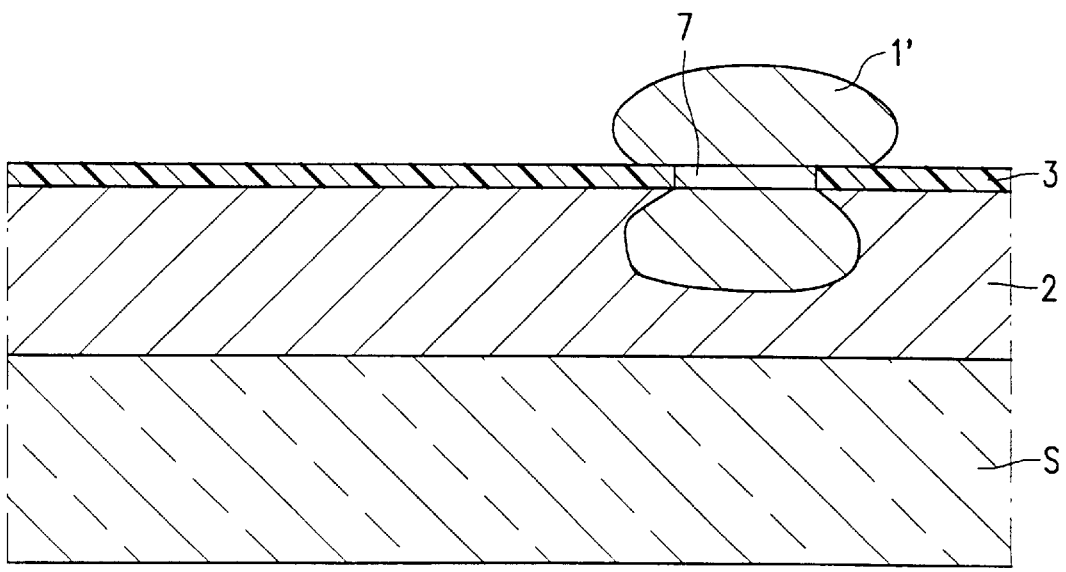
FIG. 6 shows the subject of FIG. 5, after the enaction thereupon of a third manufacturing step (electrolytic deposition)

FIGS. 4–6 depict various aspects of a possible manufacturing procedure by means of which a sensor as depicted in FIG. 1 can be produced.

In FIG. 4, a substrate S (e.g. glass) has been provided with a magnetic layer 2 (e.g. permalloy: $Ni_{0.8}Fe_{0.2}$). The layer 2 is then covered with a layer 3 of non-metallic material (e.g. $Al_2O_3$). In this particular example, the layer 2 has a thickness of about 300 nm, whereas the layer 3 has a thickness of approximately 10 nm.

Layers 2 and 3 can, for example, be provided using a technique such as sputter deposition or vapour deposition, whereby layer 2 is deposited in vacuum and layer 3 is deposited in an oxygen atmosphere.

Due inter alia to various crystalline imperfections at the interface between the layers 2 and 3, the layer 3 will naturally contain small "pinholes" 5 at scattered locations. In conventional thin-film applications, such pinholes are regarded as a nuisance, and one generally strives to reduce their occurrence as far as possible. However, in the current context, the occurrence of these pinholes 5 will actually be exploited. Since it will generally have a width of the order of 2–5 nm, such a pinhole can serve as an ideal starting structure for the growth of a magnetic constriction as referred to in claim 1.

FIG. 5 shows the subject of FIG. 4 after its immersion in an electrolyte bath (e.g. a mixture of $NiSO_4.6H_2O$ (15 g/l), $FeSO_4.7H_2O$ (2.25 g/l) and $H_3BO_3$ (6.77 g/l) in the case of a permalloy layer 2). By temporarily applying a positive voltage to the magnetic layer 2, part of the layer 2 has been dissolved, causing the creation of a small cavity 5' underneath the hole 5.

In FIG. 6, the subject of FIG. 5 has been placed in the same electrolyte bath, and a negative voltage has been applied to the layer 2. As a result, electrodeposition of magnetic material (permalloy) has occurred in the hole 5 and cavity 5', causing the growth of a "bulb" 1' of magnetic material on top of the hole 5.

As here depicted, the bulb 1' may be considered as a magnetic layer as referred to in claim 1. However, if so desired, the bulb 1' can be broadened out by electroless deposition of magnetic material (permalloy) on top of the layer 3 and the bulb 1' (using sputter deposition, for example), which may be optionally followed by further electrodeposition from the electrolyte bath referred to above.

Embodiment 4

Figure 7:
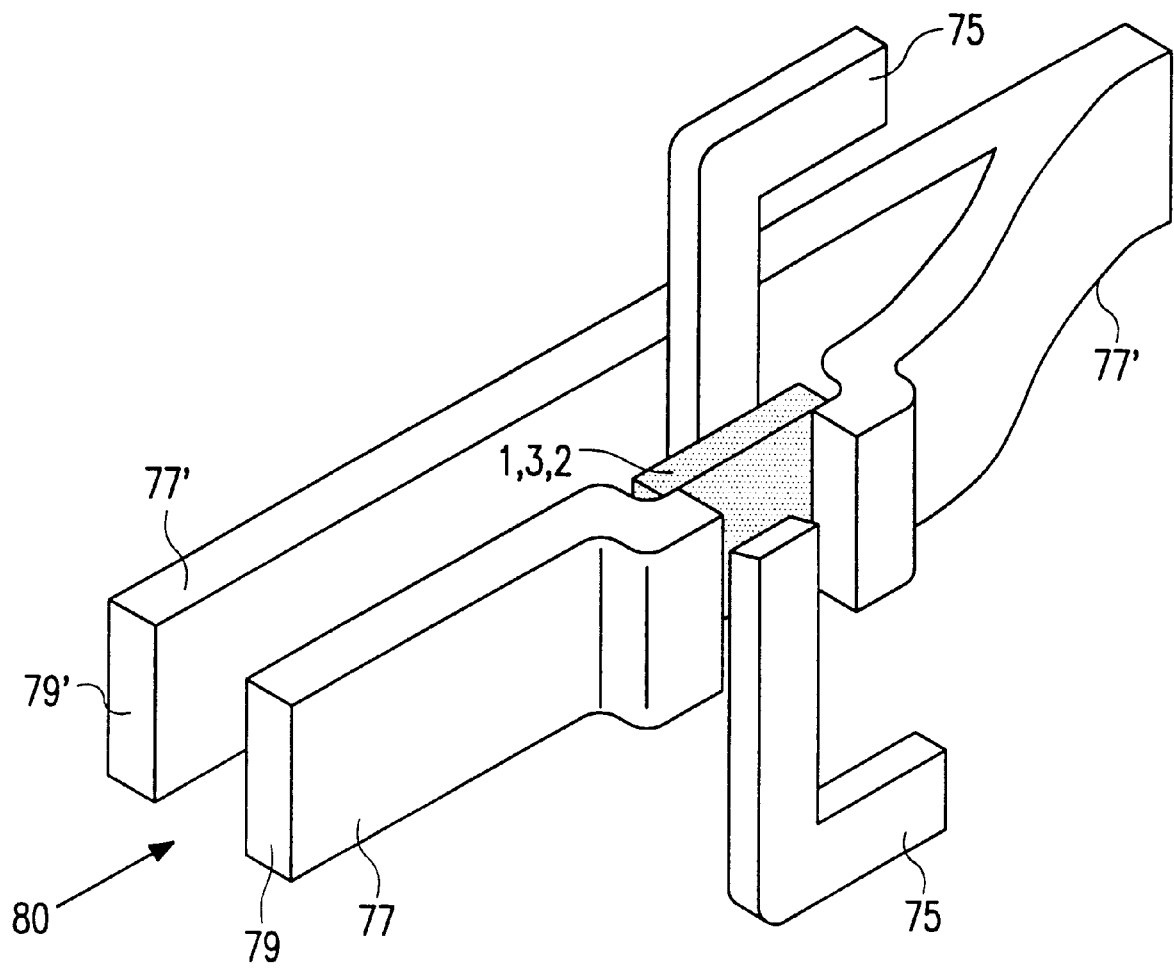
FIG. 7 renders a perspective view of a particular embodiment of a sensor according to the invention, with flux guides and electrical connections.

FIG. 7 is a schematic perspective view of part of a magneto-resistive magnetic read head (magnetic field sensor) according to the invention. The head comprises a magnetic/non-metallic/magnetic trilayer 1,3,2 as described in Embodiment 1, 2 or 3, with electrical connections 75. The head additionally comprises flux guides 77,77', which are positioned relative to the trilayer 1,3,2 so as to form a magnetic circuit. The end faces 79,79' form part of the pole face of the head, the magnetic gap 80 being located between said faces 79,79'.

If a magnetic medium, such as a magnetic tape, disc or card, passes before the faces 79,79' in close proximity thereto, the magnetically-stored information on that medium will generate a varying magnetic flux in the above-mentioned magnetic circuit, which magnetic flux is also fed through the trilayer 1,3,2. The trilayer 1,3,2 transcribes this varying magnetic flux into electrical resistance variations, which can be measured via the electrical connections 75.

The head may also contain an electrical coil, which can be employed in the recording of magnetic information on magnetic media.

Embodiment 5

Figure 8:
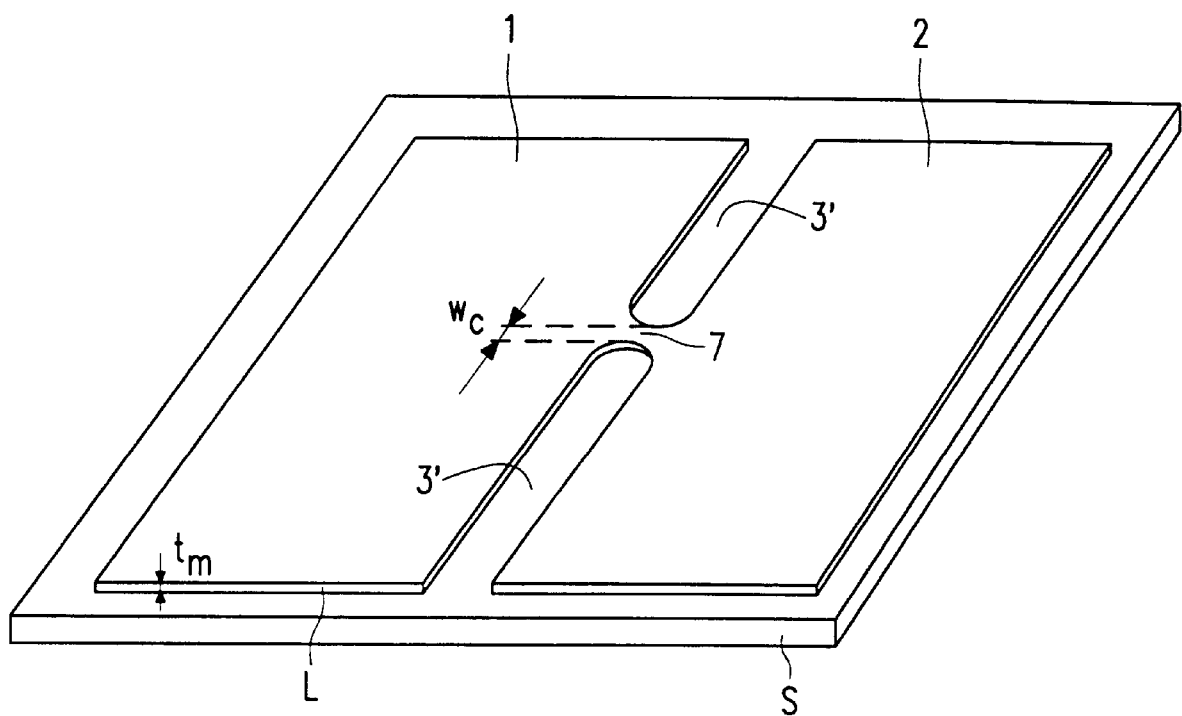
FIG. 8 gives a perspective view of a coplanar embodiment of the sensor according to the invention.

FIG. 8 renders a perspective view of a part of a particular embodiment of a sensor according to the invention, in which the magnetic layers 1,2 and the constriction 7 are co-planar.

An electrically insulating substrate S (e.g. Si) is provided with a uniform layer L of magnetic material (e.g. Co). This layer L has a thickness $t_m$ of the order of 100 nm, for example. Using selective masking and etching techniques well known in the art, a pair of channels 3' is etched out of the layer L (right down to the substrate S), in such a manner as to create two magnetic layers 1,2 which are mutually connected by a narrow constriction 7 defined by the channels 3'. The width of this constriction is $w_c$.

In a preferential embodiment, the layer-thickness of the constriction 7 is less than $t_m$. This may, for example, be achieved by partially etching away the constriction 7 in the direction of the substrate S.

We claim:

1. A magneto-resistive magnetic field sensor, comprising two electrical connections and a body of magnetic material, said body being arranged to form at least a part of an electrically conductive path between said electrical connections, the electrical resistance of said path being a measure of magnetic field strength in at least a portion of said body, characterized in that said body comprises two layers of magnetic material interconnected by a constricted region formed of magnetic material, said constricted region being part of said current path and having a direction of sensing current flow through the constriction, each of said layers having a respective volume and the constricted region having a volume much less than the smaller of said respective volumes.

2. A sensor as claimed in claim 1, characterized in that the sensor further comprises at least one flux guide arranged to concentrate magnetic flux from an external source into the vicinity of said magnetic layers.

3. A sensor as claimed in claim 1, characterized in that the magnetic layers and the constricted region are formed by a single magnetic material.

4. A sensor as claimed in claim 3, characterized in that said magnetic material is selected from the group consisting of Fe, Co, Ni and their alloys, together with $Fe_3O_4$ and PtMnSb.

5. A sensor as claimed in claim 1, characterized in that said layers are parallel and spaced apart, in a direction perpendicular to the layers, by said constricted region, and said constriction has a cross section, in a direction parallel to said layers, having a least dimension $w_c$ which is less than one micron.

6. A sensor as claimed in claim 5, characterized in that the sensor further comprises at least one flux guide arranged to concentrate magnetic flux from an external source into the vicinity of said magnetic layers.

7. A sensor as claimed in claim 1, characterized in that said constricted region is formed of a given magnetic material having an average magnetic domain size D, and said constricted region has a cross section, in a direction perpendicular to the direction of current flow through said constriction, having a least dimension $w_c$ which is less than one micron, whereby the dimension $w_c \ll D$, and the magnetic system formed by the two magnetic layers and the constricted region contains only one domain wall.

8. A sensor as claimed in claim 7, characterized in that the sensor further comprises at least one flux guide arranged to concentrate magnetic flux from an external source into the vicinity of said magnetic layers.

9. A sensor as claimed in claim 7, characterized in that $w_c \leq 100$ nm.

10. A sensor as claimed in claim 3, characterized in that said two layers are arranged in a stack, and are separated by an intermediate non-metallic layer having a hole therethrough, said hole being filled with the magnetic material forming said constricted region.

11. A sensor as claimed in claim 10, characterized in that the non-metallic material is selected from the group consisting of silicon, silicon oxide, silicon nitride and aluminum oxide.

12. A sensor as claimed in claim 3, characterized in that said layers and the constricted region are substantially co-planar.

13. A sensor as claimed in claim 12, characterized in that the magnetic layers and the constricted region are formed by a single magnetic material.

14. A sensor as claimed in claim 13, characterized in that said magnetic material is selected from the group consisting of Fe, Co, Ni and their alloys, together with $Fe_3O_4$ and PtMnSb.

15. A sensor as claimed in claim 12, characterized in that the sensor further comprises at least one flux guide arranged to concentrate magnetic flux from an external source into the vicinity of said magnetic layers.

16. A sensor as claimed in claim 12, characterized in that said constricted region is formed of a given magnetic material having an average magnetic domain size D, and said constricted region has a cross section, in a direction perpendicular to the direction of current flow through said constriction, having a least dimension $w_c$ which is less than one micron, whereby the dimension $w_c \ll D$.

17. A sensor as claimed in claim 16, characterized in that $w_c \leq 100$ nm.

* * * * *